United States Patent [19]
Shim et al.

[11] Patent Number: 6,124,147
[45] Date of Patent: Sep. 26, 2000

[54] METHOD FOR FABRICATING OPTOELECTRONIC DEVICE IN LOW-TEMPERATURE DEPOSITION AND THERMAL TREATMENT

[75] Inventors: Kyu Hwan Shim; Mun Cheol Paek; Kyoung Ik Cho, all of Daejeon, Rep. of Korea

[73] Assignee: Electronics and Telecommunications Research Institute, Daejon, Rep. of Korea

[21] Appl. No.: 09/195,691

[22] Filed: Nov. 19, 1998

[30] Foreign Application Priority Data

Sep. 17, 1998 [KR] Rep. of Korea ............... 98-38422

[51] Int. Cl.⁷ ............................................. H01L 21/00
[52] U.S. Cl. ........................ 438/46; 438/47; 438/37; 438/931; 438/954; 372/43; 257/72; 257/102
[58] Field of Search ............................ 438/46, 47, 37, 438/931, 954; 372/43, 50; 257/72, 102

[56] References Cited

U.S. PATENT DOCUMENTS

| | | |
|---|---|---|
| 4,382,837 | 5/1983 | Rutz . |
| 4,489,128 | 12/1984 | Rutz ........................... 428/332 |
| 4,908,539 | 3/1990 | Meyer . |
| 5,127,990 | 7/1992 | Pribat et al. . |
| 5,281,831 | 1/1994 | Uemoto et al. ............... 257/102 |
| 5,326,992 | 7/1994 | Yoder ........................... 257/77 |
| 5,385,862 | 1/1995 | Moustakas . |
| 5,787,104 | 7/1998 | Kamiyama et al. ............ 372/43 |
| 5,874,747 | 2/1999 | Redwing et al. ............... 257/77 |
| 6,023,077 | 2/2000 | Iyechika et al. ............... 257/103 |

OTHER PUBLICATIONS

Ivor Brodie et al., "Vacuum Microelectronic Devices", Proceedings of the IEEE, vol. 82, No. 7, Jul. 1994, pp. 1006–1034.

H.S. Kong et al., "Chemical Vapor Deposition and Characterization of 6H–SiC Thin Films on Off–axis 6H–SiC Substrates", J. Appl. Phys. 64(5), Sep. 1, 1988, pp. 2672–2679.

John A. Edmond et al., Blue LEDs, UV Photodiodes and High–temperature Rectifiers in 6H–SiC, 1993—Elsevier Science Publishers B.V., pp. 453–460.

Primary Examiner—John F. Niebling
Assistant Examiner—Viktor Simkovic
Attorney, Agent, or Firm—Jacobson, Price, Holman & Stern, PLLC

[57] ABSTRACT

The present invention relates to a semiconductor device and, more particularly, to a short-wavelength optoelectronic device and a method for fabricating the same. The optoelectronic device according to the present invention doesn't have to employ an ion implantation process and an ohmic contact to make the n-p junction in the WB compound semiconductor, providing a sufficient efficiency for display. The method according to the present invention comprises the step of a) forming a SiC:AlN super lattice multilayer by alternately forming a SiC epitaxial film and an AlN epitaxial film on a substrate, wherein the AlN film is formed and the SiC film is formed using a single source gas of 1,3disilabutane in an nitrogen plasma-assisted metalorganic molecular beam epitaxy system; and b) applying a thermal treatment to the SiC:AlN super lattice multilayer, thereby a mixed crystal compound having $(SiC)_x(AlN)_{1-x}$ quantum wells obtained by a diffusion of SiC film and AlN.

8 Claims, 4 Drawing Sheets

$(SiC)_x(AlN)_{1-x}$
MULTI-LAYER QUANTUM WELL $(SiC)_x(AlN)_{1-x}$
MULTI-LAYER QUANTUM WELL

METHOD FOR FABRICATING OPTOELECTRONIC DEVICE IN LOW-TEMPERATURE DEPOSITION AND THERMAL TREATMENT

BACKGROUND OF THE INVENTION

1. Field of the Invention

The present invention relates to a semiconductor device and, more particularly, to a short-wavelength optoelectronic device and a method for fabricating the same.

2. Description of the Related Art

A short-wavelength laser display has been widely used in ultra-density optical recording media, medical instruments, measuring instruments and lithography light sources using deep ultraviolet (DUV). This short-wavelength laser can increase the memory capacity of devices used in the multimedia and information communicating equipments up to tens of times from a few giga byte. Since ultraviolet lasers using the He—Cd gas plasma or frequency modulation manner require large and expensive equipment, these may not be available to the microelectronics.

Compound semiconductors, such as SiC, AlN and GaN, having the wide energy band-gap (WB) have been widely used as short-wavelength optical devices. Finally, blue light-emitting diodes of 400 to 500 nm wavelength have been developed since 1994. Recently, laser diodes having operating time of more than 10,000 hours have been reported. However, DUV semiconductors emitting the wavelength of less than 360 nm have not been yet implemented. The essential reason for this failure is based on the large electric and junction resistance which make the carrier (electrons or holes) injection difficult.

Also, it has been reported that electron-hole pairs (EHPs) are produced by injecting accelerated electrons, which are extracted from field emission devices, into the compound semiconductors, such as SiC, AlN and GaN, and the high emission features are achieved by generating photons through the cathodoluminescence, stimulating the EHPs, inducing the resonance of photons and trapping the photons within the restrict region of an optoelectronic device which has a quantum well and optical reflection films. This manner provides efficient methods in fabricating the optoelectronic devices, such as LED and LD, which generate high energy photons.

The field emission devices emits the electrons through the tunneling effect which is based on the voltage difference between the cathode tip and the grid. As known in the Fowler-Nordheim tunnelling, the electron beam efficiency depends on the work function of the cathode, the diameter of the probe and the voltage difference between the grid and the probe. The generated electrons, which are accelerated at a high energy of a few tens of KeV, are injected into the optoelectronic devices. To increase the emission efficiency, the optoelectronic devices traps the EHPs, which are generated by the hot electrons, within a restricted narrow area. An epitaxial structure made up of the multiple quantum well, which is formed in the WB compound semiconductor, can implement a ultraviolet device together with a micro vacuum electron gun so that it can be used as an optical memory device.

The energy level, which provides the EHPs using the electron beam and provides the recombination, is determined by the multiple quantum wells made from mixed crystal compounds such as $(SiC)_x(AlN)_{1-x}$. However, in the deposition of the mixed crystal compounds using the molecular beam epitaxy and metalorganic CVD methods, the deposition temperature should be higher. Further, since the pressure of nitrogen gas for depositing AlN is very high, it is impossible to obtain an epitaxial film growing method in which each of four elements is evenly distributed on the quadri-mixed crystal compound.

The conventional MBE method using a gas source has a high growing rate of about 1 $\mu$m/h by employing the ammonia ($NH_3$) pyrolysis of high reactivity, but the temperature for the pyrolysis should be higher than 1100° C. Further, this method has a drawback in that the equilibrium gas pressure on the surface of the epitaxial film is high in the nitrogen gas and then results in the deterioration of its quality.

For the purpose of the formation of SiC film, there is provided a method to evaporate a silicon ingot and carbon filament for Si and C, respectively, using the electron beam deposition. The deposition rate is very slow, the sources are frequently replaced with others and then the impurities in the processing chamber deteriorates its quality.

The short in a specific film to be formed can be generated around the high voltage electron beam chamber by means of a film which is previously formed by the repetition and continuous deposition processes. In case where TMAI (trimethyl aluminum) or ammonia gases, since it is impossible to employ the electron beam deposition equipment which must operate in high vacuum, this method is not economical and not appropriate for the growth of the SiC—AlN super lattice.

SUMMARY OF THE INVENTION

Therefore, the present invention has been made in view of the above-mentioned problems, and an object of the present invention is to provide a short-wavelength optoelectronic device having evenly distributed atoms in the crystalline of mixed crystal compounds.

Another object of the present invention is to provide an epitaxial film in which each of four elements is evenly distributed on the mixed crystal compound.

Further another object of the present invention is to provide a mixed crystal compound of $(SiC)_x(AlN)_{1-x}$ having high reliability.

Still another object of the present invention is to provide a method for fabricating a short-wavelength optoelectronic device having an energy bad gap of 4 to 6 eV, that is, operating in DUV.

In accordance with an aspect of the present invention, there is provided a method for fabricating a short-wavelength optoelectronic device comprising the steps of: a) forming a SiC:AlN super lattice multilayer by alternately forming a SiC epitaxial film and an AlN epitaxial film on a substrate, wherein the AlN film is formed and the SiC film is formed using a single source gas of 1,3disilabutane in an nitrogen plasma-assisted metalorganic molecular beam epitaxy system; and b) applying a thermal treatment to the SiC:AlN super lattice multilayer, thereby a mixed crystal compound having $(SiC)_x(AlN)_{1-x}$ quantum wells obtained by a diffusion of SiC film and AlN.

BRIEF DESCRIPTION OF THE DRAWINGS

A further understanding of the nature and advantage of the present invention will become apparent by reference to the remaining portions of the specification and drawings, in which.

DETAILED DESCRIPTION OF THE PREFERRED EMBODIMENT

A detailed description of an embodiment according to the present invention will be given below with reference to the attached drawings.

Figure 1:
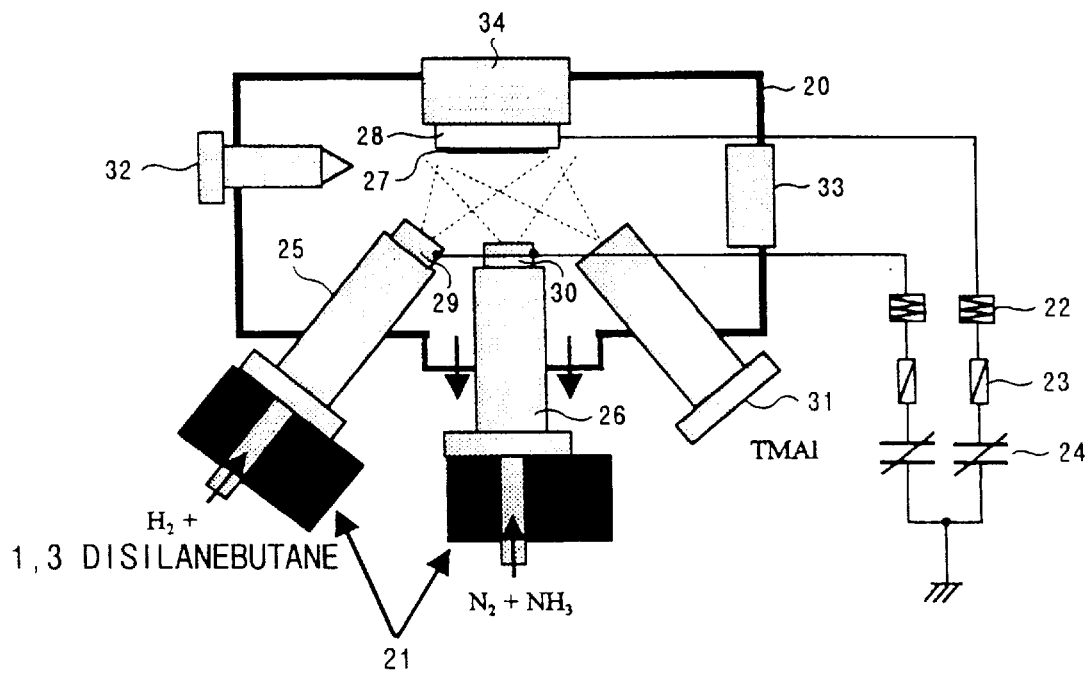
FIG. 1 is a schematic view illustrating PA-MOMBE system according to the present invention.

Referring to FIG. 1, a PA-MOMBE (plasma-assisted metalorganic molecular beam epitaxy) system according to the present invention is shown. The PA-MOMBE system according to the present invention is suitable for the SiC—AlN super lattice and its chamber 20 maintains high vacuum using a turbo pump (not shown) having the durability against chemical material. A RF power (not shown) operates in a range of about 600 W at 13.56 MHz and a RF matching box 21 is made up of capacitors capable of maintaining the reflection rate of 5% or less. To provide stable plasma to the chamber 20, the pressure of the chamber 20 is controlled and the introduced gases are in a range of 0.5 to 4 sccm through a mass flow controller (not shown). The energy (1 to 28 eV) and the flow rate ($10^{11}$ to $10^{13}/cm^2$) are in a proportion to ½ order of the applied power, but in an inverse proportion to the gas flow rate. That is, since the pressure is low at a low gas flow rate, the energy of the electron becomes high so that the dissolution efficiency of gases increases. However, when the gas flow rate is lower than 0.5 sccm, the dissolution efficiency of gases may decrease with the decrease of the elastic impact probability which is based on the decrease of the concentration of ions and electrons, thereby resulting in unstable plasma deteriorating the growth rate and reappearance of the growing atomic film. To apply voltage to electrodes 29 and 30 on source cells 25 and 26, respectively, and electrode 28 being in contact with a substrate 27, each of the electrodes is electrically connected to a RF choke 22, a resistor 23 and a DC power supply 24. The DC power supply 24 provides voltage and current up to 1 kV and 0.1 A, respectively, and the RF choke 22 acts as a filter for preventing RF power of more than 1 MHz from being applied to the DC power supply 24.

Typically, atoms on a growing specimen needs a half of dissociation energy (about 30 eV) of atoms within the crystal so that the ions of about 15 eV have an effect on the reaction on the surface of the crystal. The surface diffusion may be activated by desorbing the adsorbed atoms and providing kinetic energy to atoms. However, since the ions having high energy of about 30 eV have an effect on the inner atomic film, such ions generates many defects in the crystal. Accordingly, parameters in generating plasma pays an important part of electrical and optical features of the crystal which is grown in the PA-MOMBE using plasma. To obtain a high quantum efficiency, the crystal of active film is grown by the ammonia ($NH_3$) pyrolysis (MOMBE mode). Also, the amount and energy of ions, which reach on the substrate 2, are controlled by applying the voltage of about 1 kV to the electrodes 29 and 30 provided on source cells 25 and 26 and the electrode 28 being in contact with a substrate 27. Because the amount and energy of ions simultaneously control the reaction on the surface of the epitaxial film and its crystal growth, the epitaxial film growth is controlled on an atom film basis.

On the other hand, the SiC epitaxial film has been grown by injecting $SiH_4$ and $CH_4$ gases into the chamber and by mixing them nearby the surface. However, this method has not been applied to the crystal growth, effectively. In the preferred embodiment of the present invention, 1,3disilanebutane as a single gas source is used to easily lead SiC molecules, having a composition rate of 1:1 for Si to C. Accordingly, under the control of the pyrolysis and no plasma, the relatively low temperature growth is available to the optoelectronic device, especially, at a temperature of approximately 900° C. and, further, such a crystal growth may be achieved at a low temperature of below 700° C., provided that the high dissolution efficiency is obtained using the RF plasma source. Accordingly, the SiC—AlN super lattice of the multiple quantum well is fabricated under the optimum conditions by means of the surface diffusion effect, which is caused by an unstable bonding of hydrogen atoms and enhances the surface reaction with the low temperature growth. In FIG. 1, the reference numeral 31 denotes a metalorganic material extracting cell, 32 a RHEED (refection of high energy electron deflection) gun for checking an arrangement of atoms on the surface, 33 a RHEED screen and 34 a heater.

Figure 2:
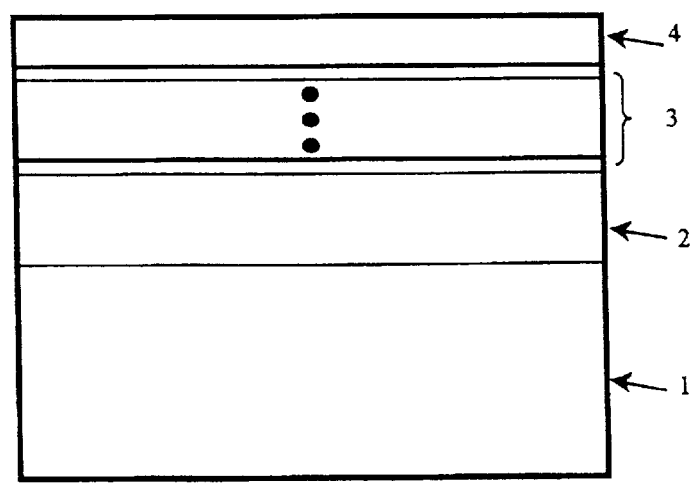
FIG. 2 is a cross-sectional view illustrating a heterostructure for an electron beam pumping according to the present invention.

Referring to FIG. 2, a cross-sectional view of an epitaxial film of the field emission device fabricated by the PA-MOMBE system of FIG. 1 is shown. A buffer film 2, such as an AlN epaxial film, is formed on a substrate 1 by varying the deposition temperature in order to minimize the interface defects. That is, the buffer film 2 is first deposited to a temperature of approximately 400 to 500° C. and the deposition temperature is increased up to a normal growing temperature of approximately 700–800° C. At this time, to increase the even surface of the thin film, the nitrogen plasma is employed at a low flow rate and a high power. The low temperature growth releases the stress generated by the difference between the lattice constants and minimizes the density of defects which are propagated into the epitaxial film to be formed on itself. Next, a SiC—AlN super lattice film 3 is formed on the buffer film 2. The SiC film is grown using low power plasma with the low growth rate and the AlN film is grown using the $NH_3$ gas.

Since the difference of the lattice constant between the SiC film and the AlN film is little, i.e., about 0.4%, the defects caused by the strain may be disregard. However, because the SiC film has the indirect transition energy band structure, its thickness must be thin in a range of approximately 1 to 3 nm in order that it has the direct transition energy band structure of the high quantum efficiency through the complete intermixture in the following thermal treatment. In addition, since the difference of the lattice constant between the GaN film and the AlN film is of 2%, the mole percentage is controlled within about 0.2 at the time of forming the heterostructure although this super lattice has the direct transition energy band structure. In forming the super lattice film of the multistructure to a thickness of a few nanometers, the molecule beam epitaxial growth is very useful. Accordingly, the quantum well film of the SiC:AlN system, which requires the delicate deposition conditions, can be formed by the MOMBE mode using the metalorganic and ammonia gases and the PAMBE mode using plasma and 1,3disilanebutane as a single gas source.

The processing chamber has a nozzle with diameter of 2 mm and a deflecting electrode at the end portion thereof in order to apply plasma to the epitaxial growth. The nozzle and deflecting electrode deflects and accelerates (or decelerates) the nitrogen ions, effectively growing the epitaxial film. The buffer film 2 is evenly formed at a low temperature and low surface movement of the ions with no roughness by using the ion beam at 20 to 50 eV. In case where plasma is optoelectronically used in forming the active film and the quantum well film, to minimize the defect generation, the ion energy is decreased less than 15 eV, the temperature of the substrate is more than 750° C. and the rate of ions to neutral particles is of 2 to 10. In addition, the reference numeral 4 denotes a cap film.

Figure 3A:
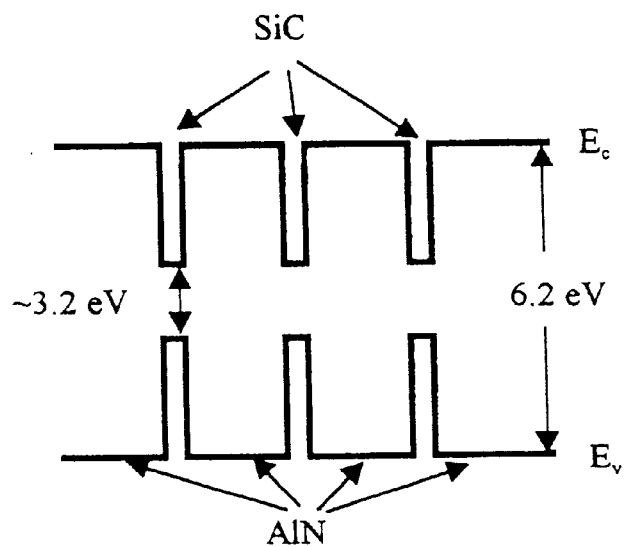
FIGS. 3A and 3B are energy band diagrams of a SiC—AlN super lattice.
Figure 3B:
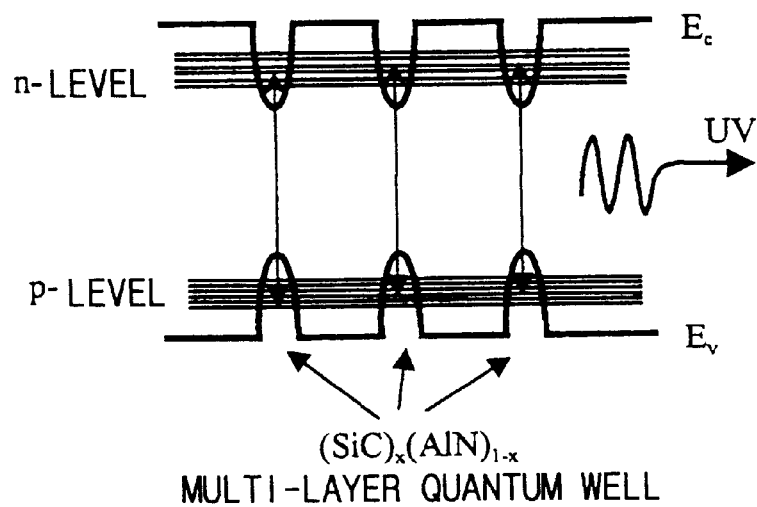

For the Bragg diffraction, the super lattice 3 should be determined according to the wavelength of the photon associated with the carrier recombination which is generated in the quantum well film, having the energy band diagram as shown in FIG. 3A. In the SiC—AlN super lattice 3, the wavelength thereof is determined by the wavelength corresponding to the recombination energy of the photons in the quantum well film. Accordingly, the shape of the quantum well film is determined by a distribution of composites formed through the mutual diffusion between the SiC and AlN films and the quantum well film has a shape in which the recombination is generated concentrically in its center. The quantum well film is formed to have a period of $\lambda/4$, the quantized energy potential thereof being formed in close order. The quantum well film is located at a portion in the center of the electron permeation depth to maximize the generation and recombination of the EHPS. When the thickness of the mixed crystal compounds, SiC film, is in a range of 1 to 53 nm, its mole percentage is in a range of 0.1, the thermal treatment and the processing time is in ranges of 1000 to 1700° C. and during 1 to 3 hours, respectively. The energy band diagram of the mentioned quantum well film is shown in FIG. 3A, having quantized electron and hole energy levels.

Figure 4:
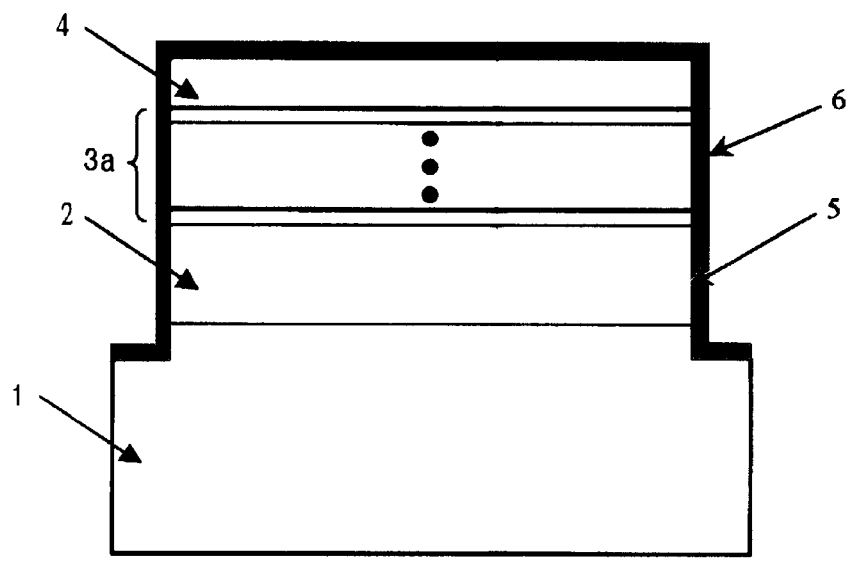
FIG. 4 is a cross-sectional view illustrating the heterostructure on which an optical reflection film is formed.

FIG. 4 is a cross-sectional view illustrating the heterostructure on which an optical reflection film is formed. As shown in FIG. 4, the heterostructure including the mixed crystal compound 3a is patterned by the reactive ion etchant with the removal of a portion of the substrate 1. At this time, $CF_4$, $CCl_2F_2$, $Cl_2$ and the like are used as the reactive gases containing Ar gas. The ion accelerated voltage caused by the plasma potential should be controlled at more than 200V. The angle between the optoelectronic device and the ion beams should be limited to 30 to 70 degrees to form a vertical wall 5 on which the photons are emitted. The temperature to prevent the photoresist film from being baked and carbonized may be maintained below 250° C. and also the remaining carbon components are removed by oxygen plasma. The oxygen plasma is formed at a pressure of 100 to 1000 mtorr and at RF power of 50 to 100 W. To decrease the defects generated below the mixed crystal compound by the etching processes, the surface of the exposed film is removed to a thickness of a few nanometers by the wet etching process using a mixture solution of $NH_3OH$, $HNO_3$ and $H_2O_2$. An optical reflection film 6 is deposited on the cap film 4, the mixed crystal compound 3a, the buffer film 2 and the etched substrate 1 in order that the focused photons are emitted in the direction of surface. The reference numeral 5 denotes the etched surface.

Figure 5:
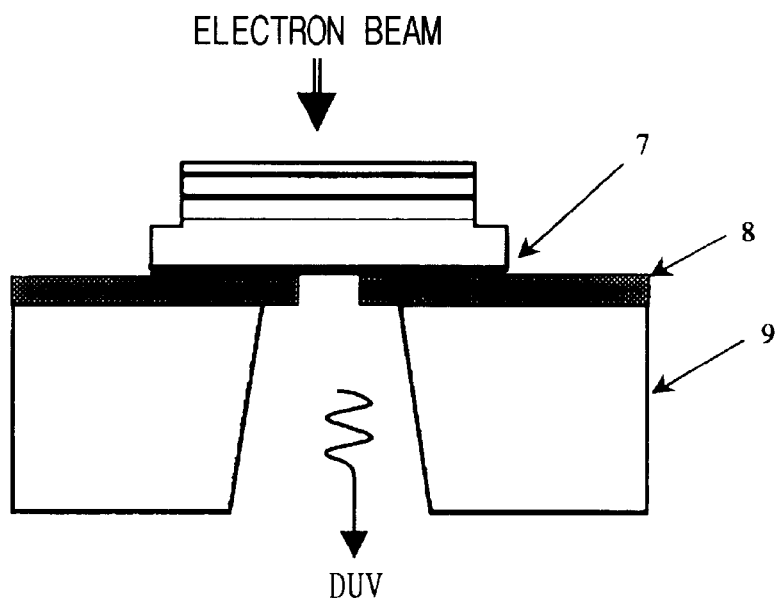
FIG. 5 is a schematic diagram illustrating an optoelectronic device mounted on a circular-shaped metal block.

FIG. 5 is a schematic diagram illustrating the photoelectric device mounted on a circular-shaped metal block, in which the photoelectric device emits the DUV by the electron beam impact. A cone-shaped hole is in the center of a circular-shaped metal block 9 made of copper. The electron beam produces the EHPs and the recombination generating the DUV is caused by the EHPs. An optical transparent film 7 is formed beneath the bottom surface of the photoelectric device to a thickness of a few micrometers, which may be an oxide film, such as MgO, $Al_2O_3$ or CaO, $CaF_2$ or a film having a high energy band gap of about 8.8 eV; for example, NaCl film, removing instability of the device by providing a surface protection effect. Also, the optical transmitting film 7 is in contact with a heat radiation plate formed on the circular-shaped metal block 9.

Since the maximum electric field not to generate plasma in the micro vacuum electron gun is about $2.5 \times 10^4$ V/cm, it may be possible to accelerate the electron beam up to several tens of kilovolt. The location, at which the photons from the electron impact are generated, is determined by the electrons having the acceleration energy of 3 to 20 keV and the EHP generation region, on which the accelerated electrons are focused, is positioned at the depth of 0.1 to 3 μm from the surface of the photoelectric device. The photons, which have higher energy than the energy level of the quantum well, are converted into other photons having the same energy by the adsorption and emission within the photoelectric device. For example, when the electron beam of energy $E_e$(keV) is introduced into a material of the density $\rho$(g/cm$^3$), the primary electron range R is given by $R = (0.052/\rho)E_e^{1.75}$ and the concentration of the EHPs can be obtained in the direction of depth from the relationship of the EHP generation. In the AlN film, the maximum concentration of the EHPs is positioned at a depth of about 0.05 μm, 0.3 μm and 0.75 μm for 5 keV, 15 keV and 25 keV, respectively.

The DUV from the photoelectric device is illuminated below, as shown in FIG. 5, by depositing the optical reflection film which prevents the photons from being emitted upwardly and focus photons and carriers into an active region therein. The holes produced in a valence band of the WB compound semiconductors device are localized because of their heavy effective mass and they may generate the localized EHPs. In the materials used in the WB compound semiconductors, since they are considerably stable in high temperature and high voltage due to the high cohesive forces and the high thermal conduction between adjacent their atoms, the possibility of their generating laser is very higher than other materials. The small sized field emission microtip technique can be available to a device for pumping ultraviolet out of a laser diode. For example, in case of $E_e=10$ keV, $I_{tip}=1$ μm and 104 tips/mm$^2$, because about 1100 EHPs per one atom are generated, $J_{e-h}$ is approximately 1.1 kA/cm$^2$. When the electron beam is introduced into the optoelectronic device in the diameter of about 1 mm, the maximum concentration of the EHPs is approximately $4 \times 10^{18}$/cm$^3$. Since this corresponds to the critical concentration, it is possible to achieve a field emission with this condition. To implement ultraviolet LEDs and LDs which can be fabricated in a small size using the electron pumping, several problems, for example, the electron focusing, thermal radiation and high vacuum package, must be solved in a fine structure.

Figure 6:
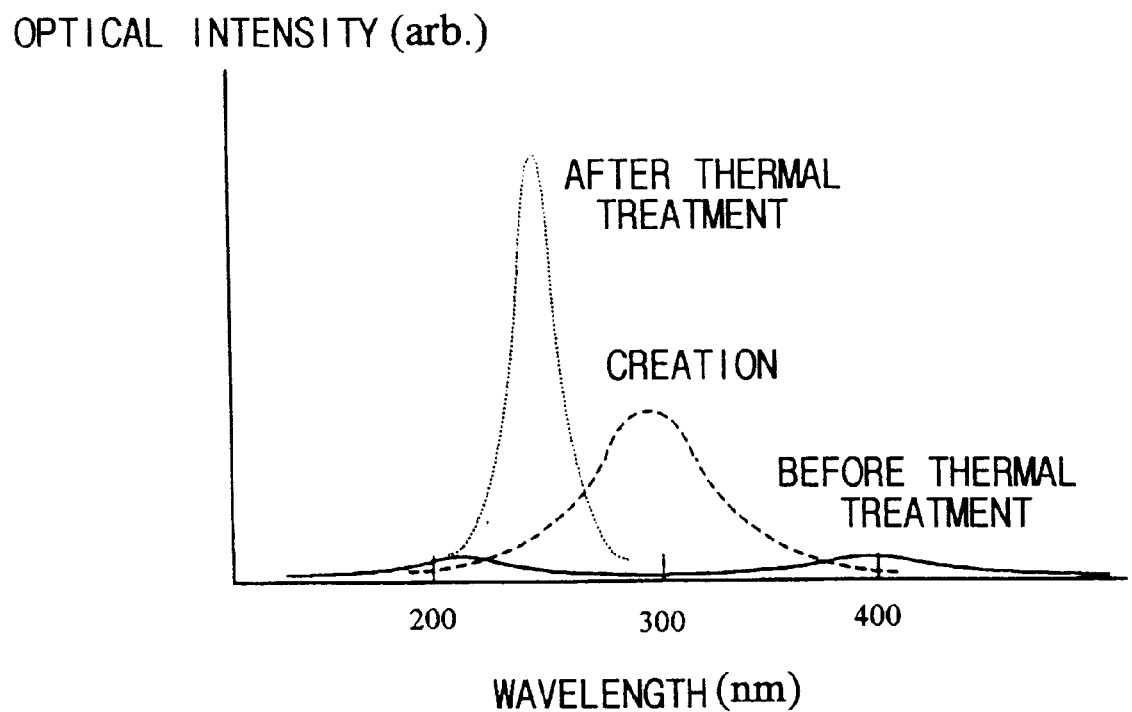
FIG. 6 is a plot showing light intensity of the optoelectronic device after and before a thermal treatment process.

Referring FIG. 6, in case where the thermal treatment is not carried out initially, there is a very week peak nearby 200 nm and 400 nm, which pertains to SiC and AlN film having an indirect transition energy band structure. However, the quantum well of the quadri-mixed crystal compound (SiC)$_x$(AlN)$_{1-x}$, which is formed by the diffusion between the SiC and AlN films, is formed at the time of the thermal treatment, and then the wavelength gets gradually short and the peak is increased with the high quantum efficiency. Considering the intensity of this luminescence under this characteristics, the wavelength of the optoelectronic device, 250 to 350 nm, can be easily controlled in the energy structure of SiC—AlN. There is a maximum peak based on the thermal treatment temperature and time, but there is an extinction phenomenon of the quantum well beyond the critical limitations in such an appropriate temperature and time. Accordingly, it is required to satisfy the optimum thermal treatment. In the present invention, it is an advantage that the photons' wavelength can be controlled by the thermal treatment condition. The thickness of the SiC epitaxial film must be in a range of 1 to 3 nm in order that a predetermined mole percentage is maintained in the quadri-mixed crystal compound which is obtained by the thermal treatment and an external quantum efficiency becomes more increasing. In addition, the thickness of the SiC epitaxial film may be determined by the thermal treatment bringing about a desired wavelength and the mutual diffusion between the SiC and AlN films.

As apparent from above, the optoelectronic device according to the present invention doesn't have to employ an ion implantation process and an ohmic contact to make the n-p junction in the WB compound semiconductor, providing a sufficient efficiency for display.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A method for fabricating a short-wavelength optoelectronic device comprising the steps of:
   a) forming a SiC:AlN super lattice multilayer by alternately forming a SiC epitaxial film and an AlN epitaxial film on a substrate, wherein the AlN film is formed and the SiC film is formed using a single source gas of 1,3disilabutane in an nitrogen plasma-assisted metalorganic molecular beam epitaxy system; and
   b) applying a thermal treatment to the SiC:AlN super lattice multilayer, thereby a mixed crystal compound having $(SiC)_x(AlN)_{1-x}$ quantum wells obtained by a diffusion of SiC film and AlN.

2. The method in accordance with claim 1, wherein the AlN film is first formed at a temperature of approximately 400 to 500° C. after which the deposition temperature of the AlN film is increased up to a normal growing temperature of approximately 700–800° C.

3. The method in accordance with claim 2, wherein the SiC film is formed by a nitrogen plasma and metalorganic and ammonia gases.

4. The method in accordance with claim 1, wherein the SiC film is formed at a RF power of below 300 W.

5. The method in accordance with claim 1, wherein the short-wavelength optoelectronic device further comprises optical reflection films thereon to reflect photons emitted from the $(SiC)_x(AlN)_{1-x}$ quantum wells in a specific direction.

6. The method in accordance with claim 1, wherein the SiC film is formed to a thickness of approximately 1 to 3 nm.

7. The method in accordance with claim 1, wherein the thermal treatment is carried out in the range of 1000 to 1700° C.

8. The method in accordance with claim 7, wherein the thermal treatment is carried out for a time period of 1 to 3 hours.

* * * * *